(12) United States Patent
Hovde et al.

(10) Patent No.: US 9,869,731 B1
(45) Date of Patent: Jan. 16, 2018

(54) WAVELENGTH-MODULATED COHERENCE PUMPING AND HYPERFINE REPUMPING FOR AN ATOMIC MAGNETOMETER

(71) Applicants: Southwest Sciences Incorporated, Santa Fe, NM (US); The Regents of the University of California, Oakland, CA (US)

(72) Inventors: David Christian Hovde, Cincinnati, OH (US); Dmitry Budker, El Cerrito, CA (US); Brian Patton, Oakland, CA (US)

(73) Assignees: The Regents of the University of California, Oakland, CA (US); Southwest Sciences Incorporated, Santa Fe, NM (US)

( * ) Notice: Subject to any disclaimer, the term of this patent is extended or adjusted under 35 U.S.C. 154(b) by 667 days.

(21) Appl. No.: 14/230,354

(22) Filed: Mar. 31, 2014

(51) Int. Cl.
   *G01R 33/26* (2006.01)
   *G01R 33/032* (2006.01)

(52) U.S. Cl.
   CPC .......... *G01R 33/26* (2013.01); *G01R 33/032* (2013.01)

(58) Field of Classification Search
   CPC ......... G01R 33/26; G01R 33/032; G04F 5/14; G04F 5/145; G01N 21/39; H03L 7/26
   See application file for complete search history.

(56) References Cited

U.S. PATENT DOCUMENTS

| 3,467,856 | A | 9/1969 | Hearn |
| 3,495,161 | A | 2/1970 | Bell |
| 4,327,327 | A | 4/1982 | Greenwood et al. |
| 4,812,767 | A | 3/1989 | Taketomi |
| 5,189,368 | A | 2/1993 | Chase |
| 6,115,401 | A | 9/2000 | Scobey et al. |
| 6,320,472 | B1 * | 11/2001 | Vanier ..................... G04F 5/145 331/94.1 |
| 6,359,916 | B1 * | 3/2002 | Zhu .......................... G04F 5/14 372/26 |
| 6,472,869 | B1 | 10/2002 | Upschulte et al. |
| 6,650,682 | B1 | 11/2003 | Diels et al. |
| 7,008,559 | B2 | 3/2006 | Chen |

(Continued)

FOREIGN PATENT DOCUMENTS

| WO | 2009073256 | 6/2009 |
| WO | 2009073736 | 6/2009 |

(Continued)

OTHER PUBLICATIONS

Acosta, et al., "Nonlinear magneto-optical rotation with frequency-modulated light in the geophysical field range", Physical Review A, 2006, 053404-1-8.

(Continued)

*Primary Examiner* — Clayton E LaBalle
*Assistant Examiner* — Ruifeng Pu
(74) *Attorney, Agent, or Firm* — Jeffrey D. Myers; Peacock Myers, P.C.

(57) ABSTRACT

An FM-NMOR magnetometer and concomitant magnetometry method comprising providing a linearly-polarized pump beam generator, employing a center wavelength approximately equal to a center wavelength of hyperfine peaks, and employing a modulation amplitude in the range HFS-3×LW to HFS.

16 Claims, 8 Drawing Sheets

(56) References Cited

U.S. PATENT DOCUMENTS

| | | | |
|---|---|---|---|
| 7,038,450 | B2 | 5/2006 | Romalis et al. |
| 7,061,958 | B2 | 6/2006 | Krupke |
| 7,323,941 | B1* | 1/2008 | Happer ............... G01R 33/26 331/3 |
| 7,378,843 | B2 | 5/2008 | Beranger |
| 7,573,264 | B2 | 8/2009 | Xu et al. |
| 7,656,154 | B2 | 2/2010 | Kawabata et al. |
| 7,723,985 | B2 | 5/2010 | Smith |
| 7,834,621 | B2 | 11/2010 | Anderson |
| 8,054,073 | B2 | 11/2011 | Tuchman |
| 8,054,074 | B2 | 11/2011 | Ichihara et al. |
| 8,264,693 | B2 | 9/2012 | Stoica et al. |
| 8,421,455 | B1 | 4/2013 | Hovde et al. |
| 8,587,304 | B2 | 11/2013 | Budker et al. |
| 8,873,061 | B1* | 10/2014 | Wells ............... G01N 21/39 356/437 |
| 2003/0189887 | A1 | 10/2003 | Dang et al. |
| 2004/0012388 | A1 | 1/2004 | Pedersen |
| 2005/0212607 | A1* | 9/2005 | Happer ............... G01R 33/26 331/94.1 |
| 2006/0227845 | A1 | 10/2006 | Degertekin et al. |
| 2007/0120563 | A1 | 5/2007 | Kawabata et al. |
| 2007/0167723 | A1 | 7/2007 | Park et al. |
| 2007/0205767 | A1 | 9/2007 | Xu et al. |
| 2010/0156547 | A1* | 6/2010 | McGuyer ............... H03L 7/26 331/94.1 |
| 2010/0289491 | A1 | 11/2010 | Budker et al. |
| 2010/0321117 | A1* | 12/2010 | Gan ............... G04F 5/145 331/3 |
| 2011/0025323 | A1* | 2/2011 | Budker ............... G01R 33/26 324/304 |
| 2012/0176130 | A1* | 7/2012 | Ledbetter ............... G01N 24/08 324/301 |
| 2013/0003766 | A1* | 1/2013 | Savchenkov ............... G04F 5/14 372/38.01 |
| 2013/0265112 | A1* | 10/2013 | Strabley ............... G04F 5/14 331/94.1 |
| 2013/0342210 | A1 | 12/2013 | Stokely |
| 2014/0197826 | A1* | 7/2014 | Pradhan ............... G01R 33/032 324/244.1 |

FOREIGN PATENT DOCUMENTS

| | | |
|---|---|---|
| WO | 2009073740 | 6/2009 |
| WO | 2009079054 | 6/2009 |
| WO | 2013055246 | 4/2013 |

OTHER PUBLICATIONS

Acosta, "Optical Magnetometry with Nitrogen-Vacancy Centers in Diamond", Ph.D. Dissertation, 2011.

Acosta, et al., "Production and detection of atomic hexadecapole at Earth's magnetic field", Cornell University Library arXiv.org, Sep. 26, 2007.

Alexandrov, et al., "Dynamic effects in nonlinear magneto-optics of atoms and molecules", J. Opt. Soc. Am. B, Jan. 2005, 7-20.

Balabas, et al., "Polarized alkali vapor with minute-long transverse spin-relaxation time", Physical Review Letters, May 10, 2010, 1-5.

Belfi, et al., "Cs CPT magnetometer for cardio-signal detection in unshielded environment", JOSA824, 2007.

Belfi, et al., "Dual channel self-oscillating optical magnetometer", J. Opt. Soc. Am. B, May 2009.

Bell, et al., "Optically Driven Spin Precession", Physical Review Letters, Mar. 15, 1961, 280-281.

Budker, et al., "Magnetometer + Gradiometer Based on Amplitude Modulation Non-Linear Magtneto Optical Rotation", Second Annual Multidisciplinary University Research Initiative (MURI) Review Meeting at NIST, Boulder, CO., Jul. 19, 2016.

Budker, et al., "Optical Magnetometry", arXiv:physics [physics. atom-ph], Nov. 26, 2006, 1-11.

Budker, et al., "Resonant nonlinear magneto-optical effects in atoms", Reviews of Modern Physics, 2002, 1153.

Castagna, et al., "A large sample study of spin relaxation and magnetometric sensitivity of paraffin-coated Cs vapor cells", Applied Physics B, 2009, 763-772.

Cheron, et al., "A new optical pumping scheme using a frequency modulated semi-conductor laser for 4He magnetometers", Optics Communications, Mar. 1, 1995, 71-74.

Demtroder, "Laser Spectroscopy, Basic Concepts and Instrumentation", 1988, 580-585.

Gawlik, et al., "Nonlinear magneto-optical rotation with amplitude modulated light", Applied Physics Letters, 2006, 131108-1-131108-3.

Gilles, et al., "Laser pumped He magnetometer", Review of Scientific Instruments, May 2001, 2253-2260.

Groeger, et al., "An improved laser pumpted cesium magnetometer using hyperfine repumping", Abstract from 2005 European Quantum Electronics Conference, 2005.

Guzman, et al., "Nonlinear magneto-optical rotation, Zeeman and hyperfine relaxation of potassium atoms in a paraffin-coated cell", Phys. Rev. A., 2006, 053415.

Harel, et al., "Spectrally resolved flow imaging of fluids inside a microfluidic chip with ultrahigh time resolution", Journal of Magnetic Resonance, 2008, 199-206.

Higbie, et al., "Robust, high-speed, all-optical atom magnetometer", Review of Scientific Instruments, 2006, 113106-1-113106-7.

Higbie, et al., "Robust, High-speed, All-Optical Atomic Magnetometer", arXiv:physics [physics-atom-ph], Sep. 6, 2006, 1-8.

Jimenez-Martinez, et al., "Sensitivity Comparison of Mx and Frequency-Modulated Bell-Bloom Cs Magnetometers in a Microfabricated Cell", IEEE Transactions on Instrumentation and Measurement, Feb. 2010, 372-378.

Kanorsky, et al., "Quantitative investigation of the resonant nonlinear Faraday effect under conditions of optical hyperfine pumping", Physical Review A, Feb. 1993, 1220-1226.

Kimball, et al., "Magnetometric sensitivty optimization for nonlinear optical rotation with frequency-modulated light: rubidium D2 line", Journal of Applied Physics, 2009, 063113.

Pustelny, et al., "Magnetometry Based on Nonlinear Magneto-Optical Rotation with Amplitude-Modulated Light", Cornell University arXiv.org, Aug. 27, 2007.

Pustelny, et al., "Nonlinear Magneto-Optical Rotation with Modulated Light in Tilted Magnetic Fields", Phy Rev A, 2006.

Xu, et al., "Construction and applications of an atomic magnetic gradiometer based on nonlinear magneto-optical rotation", Review of Scientific Instruments, 2006, 083106-1-083106-2.

Yu, et al., "Using a new Liquid-Crystal Polarization Modulator for a Polarimetric Glucose Sensor", Proc. of SPIE, vol. 5852, Third Intl. Conf. on Experimental Mechanics and Third Conf. of the Asian Committee on Experimental Mechanics, 2005.

\* cited by examiner

WAVELENGTH-MODULATED COHERENCE PUMPING AND HYPERFINE REPUMPING FOR AN ATOMIC MAGNETOMETER

STATEMENT REGARDING FEDERALLY SPONSORED RESEARCH OR DEVELOPMENT

This invention was made with government support under Contract No. N68335-10-C-0576 awarded by the U.S. Department of the Navy. The government has certain rights in the invention.

CROSS-REFERENCE TO RELATED APPLICATIONS

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

Field of the Invention (Technical Field)

The present invention relates to magnetometry, particularly atomic magnetometry in alkali vapors that are pumped with linearly polarized light. The invention provides a way to both pump an optical coherence and simultaneously provide repumping to reduce the signal loss associated with unwanted hyperfine pumping in laser-based alkali vapor magnetometers.

Description of Related Art

Magnetometers are used in a number of areas. These include the measurement of Earth's field to understand dynamics of space weather, measuring laboratory fields to ensure that they conform to some desired experimental condition, mapping variations in Earth's field to find finding buried or sunken objects such as archeological artifacts, pollutants stored in steel drums, or mineral and oil deposits, or to measure magnetized materials, for instance as part of a nuclear magnetic resonance instrument. A variety of commercial magnetometers exist to meet these needs, varying in performance metrics such as sensitivity, bandwidth, cost, size and power consumption. Another key attribute is whether the magnetometer measures one or more vector components of the magnetic field, or whether it is sensitive only to the overall magnitude of the field, regardless of its direction. The latter is known as a scalar magnetometer.

Among commercial and experimental magnetometers, optically-pumped atomic magnetometers are known for achieving very high sensitivity (in the range of 1 pT per root hertz) as scalar magnetometers. These atomic magnetometers work by creating coherence among the magnetic sublevels, leading to a time dependence of an observable property. This time dependence is analyzed to determine the magnetic field. When the pumping utilizes circular polarization it creates a coherence known as orientation, while when pumping using linearly polarized light, the coherence is known as alignment. It is also possible to pump higher order coherences. V. Acosta, et al., "Nonlinear magneto-optical rotation with frequency-modulated light in the geophysical field range", Phys. Rev. A 73, 053404 (2006).

The sensitivity of an atomic magnetometer depends on a number of factors. Chief among them are the lifetime of the coherence (which is related to the width of the observed resonance) and the number of coherent spins (which is related to the strength of the observed resonance). High sensitivity to magnetic fields is achieved with long lifetimes and by probing a large numbers of coherent spins. Because collisions with the cell walls relax the atomic coherence, one way to achieve a long coherence lifetime is to use a large cell. Another approach is to use special coatings on the walls of the cell. N. Castagna, et al., "A large sample study of spin relaxation and magnetometric sensitivity of paraffin-coated Cs vapor cells", Applied Physics B 96(4): 763-772, 2009; M. V. Balabas, et al., Physical Review Letters 105, 4 (2010).

Among atomic magnetometers, there is a class of devices based on metastable helium and another based on alkali atoms (particularly potassium, cesium and rubidium). The present invention is concerned primarily with alkali vapor magnetometers. In these magnetometers, a sample of the alkali is held in high vacuum, typically in a glass cell. Light passes through the cell to create the coherence. Early versions used light from suitably-filtered atomic emission lamps, but most magnetometers now use laser light sources, and this invention is primarily concerned with laser based light sources because the wavelength of such sources can be rapidly varied.

Figure 1:
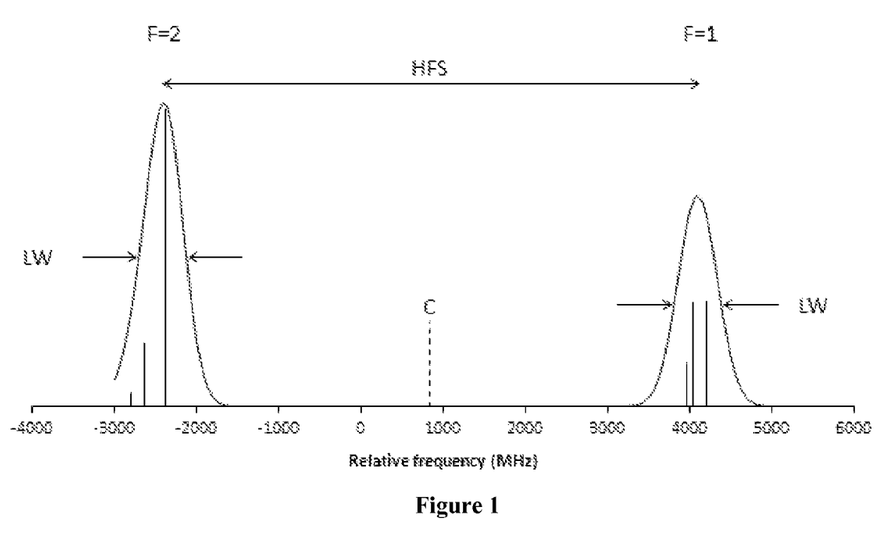
FIG. 1 shows the calculated spectrum of the D2 transition of Rb-87 near 780 nm, including hyperfine structure. The stick spectrum shows individual transitions are labeled by electronic ground and excited state (primed) quantum number F. The smooth curve shows the spectrum expected from Doppler broadening of the individual transitions. Transitions originating in the F=1 state are distinct from those originating in the F=2 state. The hyperfine splitting (HFS) is marked, as is the unweighted center C of the spectrum. The spectra have approximately equal linewidths LW.

All the naturally occurring alkali atoms have nonzero nuclear spin. For instance, K-39 has spin I=3/2, as does Rb-87; while Rb-85 has spin of 5/2 and Cs-133 has spin 7/2. The nuclear spin couples to the electronic spin to give states with total angular momentum $F=I\pm1/2$. In a thermally-equilibrated sample at almost any temperature, about half the atoms will be in the state $F=I+1/2$, and the rest in the state $F=I-1/2$. For instance, in Rb-87 the ground electronic state includes levels with F=1 and F=2. Transitions from these levels to levels in the excited electronic states result in hyperfine structure of the optical spectrum. The spectrum that arises from allowed transitions among these energy levels is shown in FIG. 1. The figure shows the stick spectrum corresponding to the transitions that would be observed if the spectral lines were infinitely narrow, and the spectrum that is observed when the lines have Doppler broadening due to thermal motions of the atoms at about room temperature. Doppler broadening is such that it partially blends transitions to different excited hyperfine levels, but the larger ground state hyperfine splittings are clearly resolved. Also marked in the figure is the unweighted center of the two hyperfine transitions.

At the magnetic fields measured by most atomic magnetometers (near Earth's field or smaller), the energy levels split into sub levels that are well described by a quantum number giving the projection of the total angular momentum along the magnetic field, where this projection Mf can take on the values $Mf=-F, -F+1, \ldots F$. There are a number of methods to create coherence among these magnetic sublevels. One method is to use cw optical pumping together with a radio-frequency magnetic field (Mx magnetometer). Commercial magnetometers from vendors such as Geometrics are based on a combination of circularly polarized light and rf coils. U.S. Pat. No. 7,656,154, to Kawabata discloses a magnetic field measurement system and optical pumping magnetometer that includes an optical magnetometer based on circularly polarized light and a radio frequency coil.

Kawabata also discloses coherent population trapping, in which microwave modulation is applied to the circularly-polarized pump laser with a microwave frequency that matches the hyperfine splitting frequency.

All-optical magnetometers have the advantages including: (1) the possibility of connecting the magnetometer measurement region to its support electronics by means of optical fibers, thus obtaining a high degree of magnetic isolation, and (2) the ease with which the optical fields can be contained, so that there is no cross-talk between magnetometers. One method is to pump the atoms with a polarized light source whose amplitude is modulated. Another method is to pump with a light source whose polarization is modulated. A third method is to pump with a light source whose frequency is modulated. All these methods have been demonstrated in the literature. U.S. Pat. No. 8,587,304, to Budker discloses an optically-pumped magnetometer using linearly-polarized pump light. The pump beam is modulated with either amplitude modulation or frequency modulation. Jimenez-Martinez (R. Jimenez-Martinez, et al., "Sensitivity Comparison of Mx and Frequency-Modulated Bell-Bloom Cs Magnetometers in a Microfabricated Cell", IEEE Transactions on Instrumentation and Measurement, Vol. 59, No. 2, February 2010) compares modulation of a circularly polarized pump beam to modulation with rf coils for a microfabricated magnetometer. The optical modulation spans a single hyperfine component of the spectrum. Similarly, U.S. Pat. No. 7,723,985, to Smith discloses a magnetometer in which the wavelength of the circularly-polarized light source is modulated across a single hyperfine component. PCT Publication No. WO2013055246A2, to Pustelny discloses a method and a device for the measurement of changes in magnetic field where the pump light is elliptically polarized. Belfi (J. Belfi, et al., "Dual channel self-oscillating optical magnetometer", J. Opt. Soc. Am. B Vol. 26, No. 5, May 2009) discloses a magnetometer where the wavelength of a circularly polarized laser is modulated, as described in more detail below.

Just as there are a number of ways to create coherence, there are a number of ways to observe it. One way is to send a probe beam through the vapor to a balanced polarimeter. The coherence can create periodic changes in the polarization state of the probe beam. D. Budker, et al., Reviews of Modern Physics 74, 1153 (2002); PCT Publication No. WO2013055246A2, to Pustelny.

The magnetic field can be inferred by tuning the frequency of the modulation; when the modulation frequency is harmonically related to the Larmor frequency, a resonant enhancement results in a strong coherence effect. Processing this resonance signal can provide its center frequency, which can be related through the Rabi-Breit equation to the amplitude of the magnetic field. A second method is to lock to the center of the resonance signal, using a self-oscillating circuit or a phase-locked oscillator. This frequency is related to the amplitude of the magnetic field. A third way is to disable the modulation and observe the free-induction decay of the coherence. Analysis of the free-induction decay yields a spectrum similar to that obtained by tuning the modulation frequency, from which the magnetic field can similarly be obtained. U.S. Pat. No. 8,421,455, to Hovde.

Figure 2:
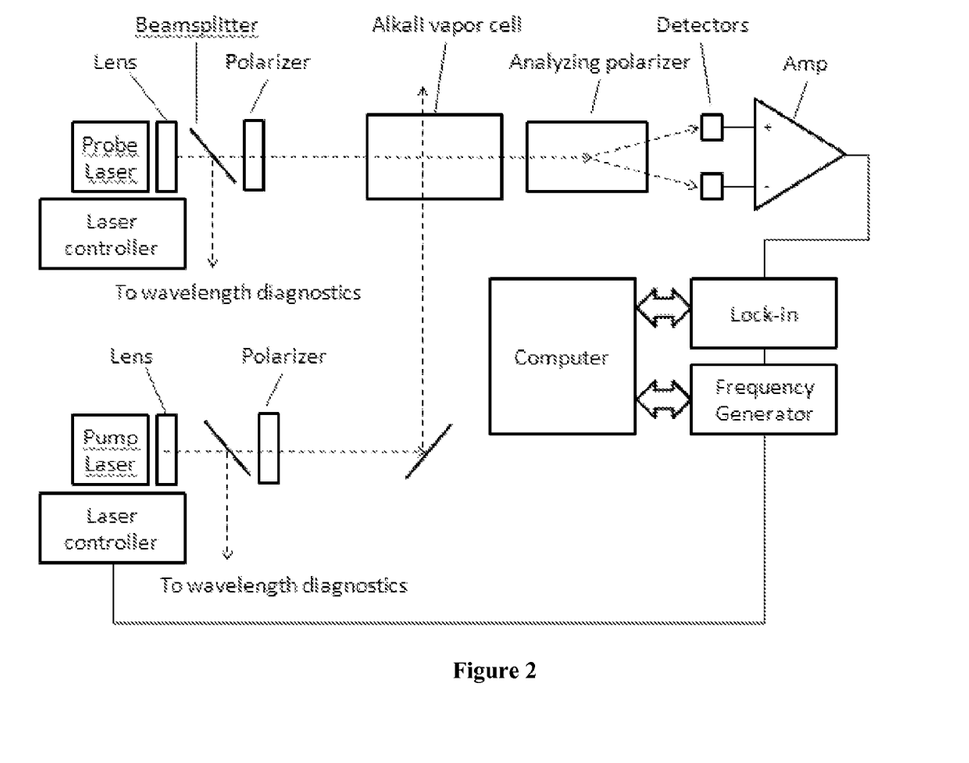
FIG. 2 shows an FM-NMOR apparatus. It includes a pump laser, a probe laser, optics to collimate the lasers, clean-up polarizers to produce linearly polarized light, the alkali vapor cell, an analyzing polarizer set to split the probe beam into two approximately equal beams, detectors positioned to collect the two probe beams, a differential amplifier of the photocurrents from the two detectors, a lock-in amplifier, a function generator, two laser controllers, and a computer interfaced to the lock-in and to the function generator. The function generator can provide a modulation waveform of variable amplitude to the current modulation input of the laser controller. The apparatus may also have means for locking the wavelength of the lasers.
Figure 3:
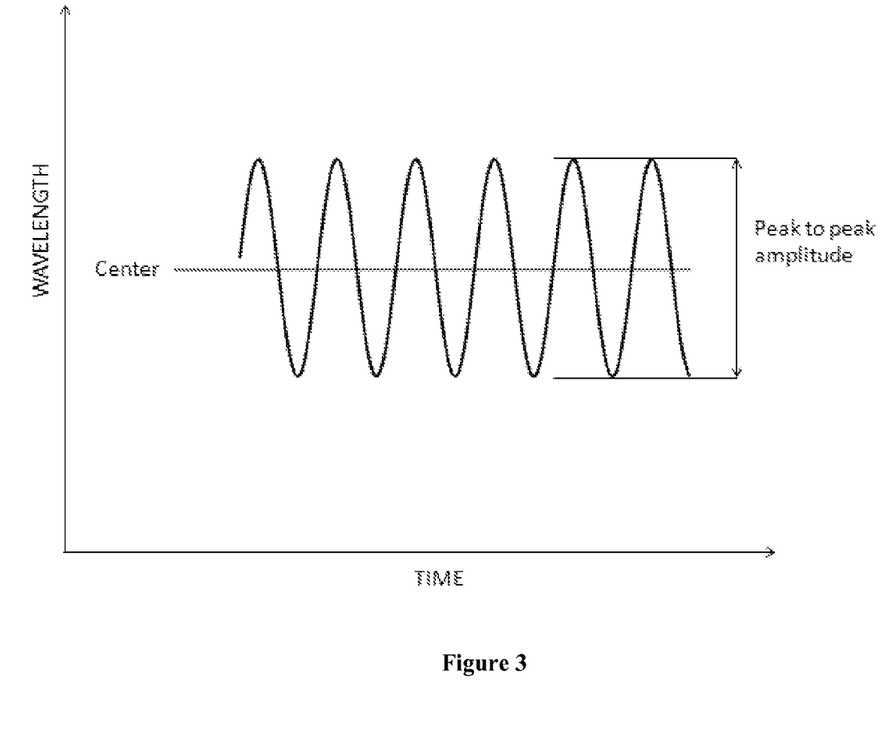
FIG. 3 shows the wavelength of the pump laser as a function of time when the modulation waveform is sinusoidal. The amplitude of the modulation from the function generator can be adjusted so that the peak-to-peak wavelength excursion is in the range HFS to HFS-6LW.

FIG. 2 shows a schematic diagram of a typical frequency-modulated nonlinear magneto-optical resonance (FM-NMOR) spectrometer, following U.S. Pat. No. 8,587,304, to Budker. The system includes a linearly-polarized pump beam whose frequency can be modulated near the Larmor frequency (FL), a linearly-polarized cw probe beam that is analyzed by a balanced polarimeter (that is, about half the transmitted probe light goes to one detector and about half to the other), fast electronics that can detect changes in the polarimeter at frequencies on the order of 2FL, and electronics that can modulate the pump beam at FL. Both pump and probe beams transverse an alkali vapor cell that has been treated to reduce wall relaxation of the coherence. Typically, some method is provided to control or adjust the optical power in both the pump and probe beams to their optimal values. The optimal power level for the pump beam represents a balance between creating a strong coherence and keeping the linewidth of the NMOR resonance narrow.

Optical pumping to create coherence can be understood as producing a definite phase relationship between sublevels of different Mf. Specially coated vapor cells help preserve this phase relationship, allowing coherence to persist for times on the order of 1 second in samples of a few cubic centimeters. An unwanted side effect of optical pumping, particularly in coated cells, is that it also results in hyperfine pumping. When the pump light is tuned to the F=2 transition in Rb-87, it excites the atoms to an upper state that can then radiate and decay to either F=2 or F=1. At the power levels needed to create a strong coherence, a significant fraction of the population of the atoms can shift into the unpumped F=1 level. Atoms in the F=1 level are not pumped and do not contribute to the NMOR signal at F=2. The vapor cell coatings that lead to long coherence lifetimes also result in slow relaxation of hyperfine levels. Thus, when operating an NMOR spectrometer, the pump power must be reduced to avoid depleting the F=2 level through hyperfine pumping.

One solution to the signal depletion from hyperfine pumping is to increase the relaxation rate. U.S. Patent Publication No. 2013/0342210, to Stokely, discloses a downhole all-optical magnetometer sensor based on circularly polarized pump light. Stokely suggests using a buffer gas to avoid hyperfine pumping. Another solution to depletion by hyperfine pump exists in the literature: it is the repump beam. In this method, a second light beam (perhaps derived from the first) pumps the F=1 level, thus operating the hyperfine pump in reverse back to the F=2 level. This limits the extent to which population can build up in unpumped level. Groeger (S. Groeger, et al., "An improved laser pumped cesium magnetometer using hyperfine repumping", Abstract from 2005 European Quantum Electronics Conference) added a second circularly polarized laser to a Cs magnetometer and observed a 300% increase in the signal. Belfi (L. Belfi, et al., "Cesium coherent population trapping magnetometer for cardiosignal detection in an unshielded environment", JOSA824, 2357-23621, [2007]) showed that a single laser could be used as a coherence pumping laser and a hyperfine repumping laser. Belfi modulated the circularly-polarized pump laser over a wide range, much greater than HFS. This allowed the laser to both pump coherence and to repump the hyperfine levels. However, the method of Belfi does not work with a magnetometer that pumps alignment with a linearly polarized laser. This is because for alignment pumping the signal changes sign depending on whether the pump is tuned to the red or the blue of the F=2 line. The broad pumping described by Belfi would pump both positive and negative NMOR signals, so that the net signal that would be observed would be very small.

Guzman (J. S. Guzman, et al., "Nonlinear magneto-optical rotation, Zeeman and hyperfine relaxation of potassium atoms in a paraffin-coated cell", Phys. Rev. A 74(5) 053415 (2006)) examined FM pumping of NMOR signals with linearly polarized light, but only a zero magnetic field. Guzman did not investigate the case where the average wavelength of the laser is equal to the center of the hyperfine peaks. Guzman explicitly states that the laser was detuned 250 MHz to the low frequency side of the potassium transition so that the light preferentially interacts with just one of the hyperfine components.

This invention provides a method for pumping alignment coherence in NMOR magnetometers using a single, linearly-polarized pump beam, while also providing signal enhancement by hyperfine repumping. The method does not require the use of circularly or elliptically polarized light. The invention does not require a second pump laser. The method does not require the addition of extra optical components beyond those typically found in an NMOR apparatus. The invention does not require reducing the optical power or introducing a buffer gas to avoid hyperfine repumping. The invention provides a stronger NMOR signal that leads to a more accurate measurement of the magnetic field. A variation of the method provides a way to lock the wavelength of the pump laser using the signal from the atomic vapor.

Also potentially pertinent to the present application is H. Gilles, et al., "Laser pumped 4He magnetometer", Review of Scientific Instruments 72, 2253 (2001).

BRIEF SUMMARY OF THE INVENTION

The present invention is of an FM-NMOR magnetometer and concomitant magnetometry method, comprising: providing a linearly-polarized pump beam generator, employing a center wavelength approximately equal to a center wavelength of hyperfine peaks, and employing a modulation amplitude in the range HFS-3×LW to HFS. In the preferred embodiment, an atomic vapor cell is used to stabilize the center laser wavelength by feedback from light passing through the atomic vapor cell, preferably with a lock-in amplifier adjusted to an odd multiple of a modulation frequency. Stabilization is done via an atomic vapor cell, preferably via broadening a line width of the atomic vapor cell by a buffer gas. The modulation amplitude is preferably in the range HFS-2×LW to HFS-LW. The modulation waveform is a simple or modified square wave or a sine wave.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 4 shows a separate alkali vapor cell used for locking the wavelength of the pump laser. Light is directed through a cell to a detector. The detector signal is amplified and can be shown on an oscilloscope or connected to a lock-in amplifier. The lock-in signal can be used in a feedback loop to stabilize the average wavelength, for instance by combining the output of a proportional-integral circuit with the output of the frequency generator, and sending the sum into the modulation input of the laser controller.

FIG. 5 shows sketches signals that could be observed when the modulation amplitude is adjusted while the average wavelength is near the center point C.

FIG. 6(b) shows the wavelength vs time of a simple square wave. Such a modulation waveform has a duty factor of 50%, which does not optimize the NMOR signal. Applying a square wave current modulation to a diode laser gives rise to the wavelength vs. time shown in FIG. 6(c) as a result of thermal effects. Thus a simple square wave current modulation waveform could be used to pump the coherence and repump the hyperfine levels provided the modulation frequency is sufficiently high that thermal effects reduce the duty factor for pumping.

DETAILED DESCRIPTION OF THE INVENTION

The present invention is preferably implemented using the NMOR apparatus described by U.S. Pat. No. 8,587,304, to Budker, when used in frequency modulation mode. The operation differs from that which has been previously described. The probe beam is preferably adjusted in the usual way to optimize the sensitivity. D. F. Jackson Kimball, et al., "Magnetometric sensitivity optimization for nonlinear optical rotation with frequency-modulated light: rubidium D2 line", Journal of Applied Physics 106, 063113 (2009). In the approach by Budker this means that the probe should be detuned from the center of one of the hyperfine peaks by about one-half line width (LW), with an optical power adjusted so that line width of the NMOR resonance is not significantly broadened, or about 1 μW for a resonance width of about 10 Hz.

The modulation frequency is preferably set equal to or scanned around the region of the Larmor frequency or a sub-harmonic, not twice the Larmor frequency. However, the signal can still be monitored at twice the Larmor frequency (the best choice when the probe laser propagates at an angle of less than 30° relative to the magnetic field) or at the Larmor frequency (the best choice when the probe beam makes an angle of greater than about 45° with the magnetic field).

The pump beam is adjusted so that its average wavelength is equal to the center of the hyperfine peaks, C. The amplitude of the modulation from the function generator is adjusted so that the peak-to-peak wavelength excursion is in the range from the peak-to-peak hyperfine splitting, HFS, to HFS-6LW. The power can be adjusted to a fairly high value, around 200 μW for a cell that gives a lifetime of 10 Hz. At this point, an NMOR signal should be detectable. Small adjustments can be made to the modulation amplitude, the laser center wavelength, and the optical power to optimize the NMOR signal, similar to the process used to optimize conventional NMOR magnetometers. The sensitivity of a magnetometer depends on the amplitude of the NMOR signal divided by its width, which are both functions of the optical pumping. However, depending on the light source and detection electronics, the noise may also be a function of the optical pumping. Thus it is usually necessary to optimize the operating conditions for a particular device.

The initial adjustment of the modulation amplitude can be made by monitoring the light transmitted through a second vapor cell (FIG. 4) filled with the same atomic vapor with sufficient path and density to give an absorbance of about 50% at line center. This cell need not be coated to preserve coherence. The pump light transmitted through this cell can be monitored using a suitably-amplified photodiode, with the signal displayed on an oscilloscope. The modulation amplitude is set to zero, then the center wavelength is set to point C, for instance by sweeping the wavelength through both hyperfine components and estimating the setting for the midpoint, or by using a wave meter to determine the laser wavelength. Next the amplitude is increased until absorption is noticed at one or both extremes of the modulation. The oscilloscope can be triggered by the modulation waveform. If absorption is seen at only one extreme of the modulation waveform, the center frequency and modulation amplitude can be readjusted to obtain absorption at both extremes. The absorption signals at each extreme should include the inner wings but not the peaks of the two hyperfine lines.

Figure 4:
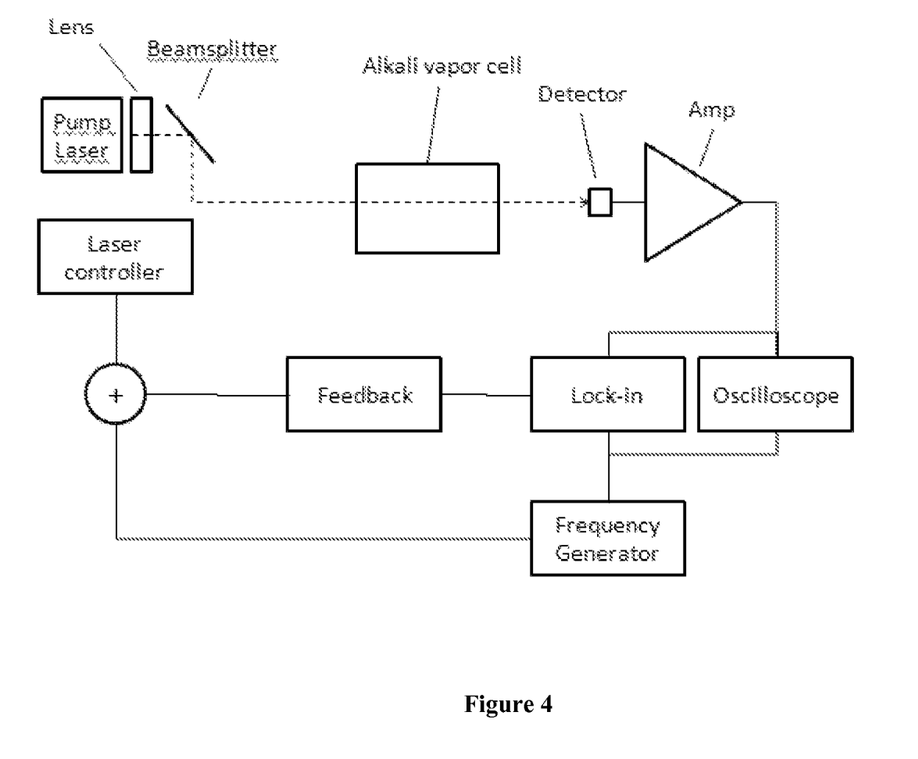
Figure 5A:
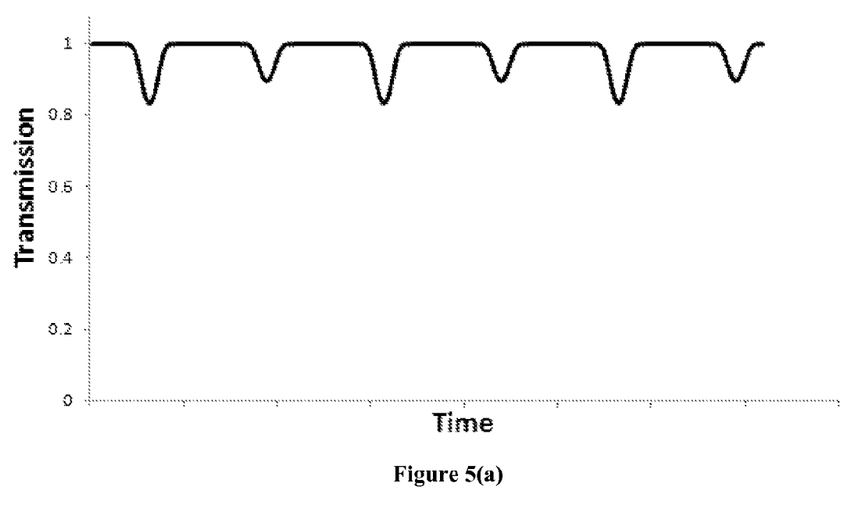
In FIG. 5(a), the modulation amplitude and center wavelength are near their optimum values.
Figure 5B:
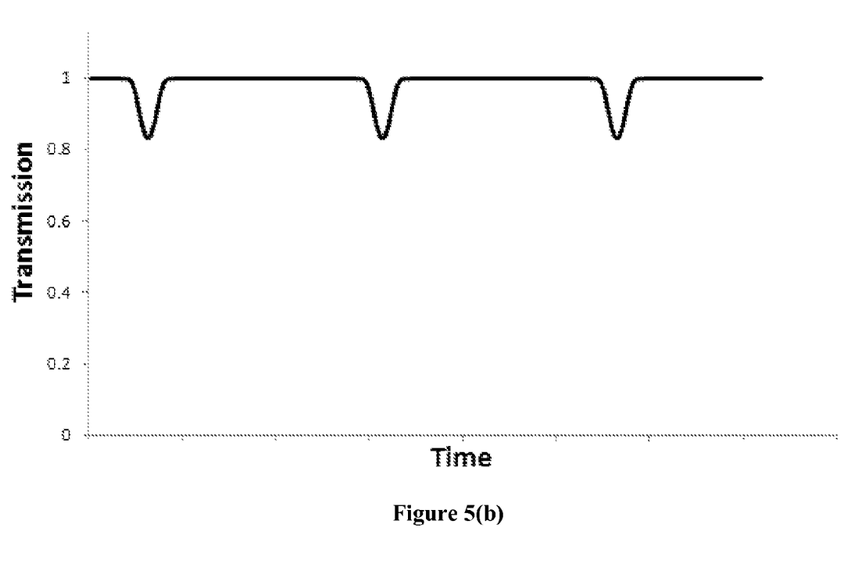
In FIG. 5(b), the center wavelength is mistuned and the modulation amplitude is too small; absorption is only observed on one edge of the waveform.
Figure 5C:
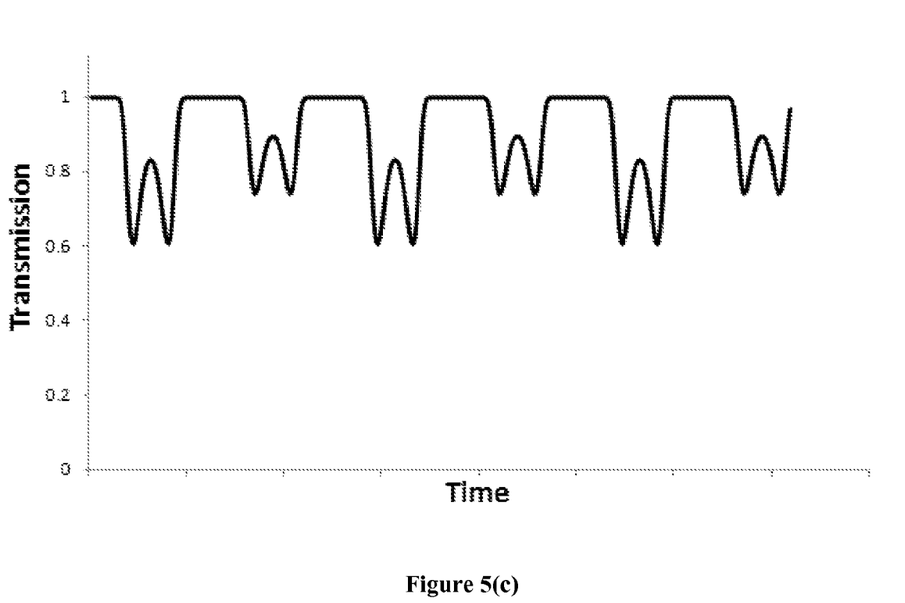
In FIG. 5(c), the amplitude is too high.

This transmission signal can also be used to stabilize the wavelength of the pump laser. By hand, adjustments to the laser temperature or current can be made to keep the absorption pattern on the oscilloscope constant. Alternatively, the signal can be routed to a lock-in amplifier, and the output used in as a line-locking discriminant, for instance as the input to a proportional-integral loop.

The alkali vapor cell used for magnetometry could simultaneously be used for locking the pump laser, provided the pump power transmitted through the vapor cell can be measured. An external cell for line locking could be fabricated with the linewidth increased by pressure broadening, so that the control range of the locking was extended. Optical fibers may be used to deliver the pump and probe beams to the magnetometer.

Figure 6A:
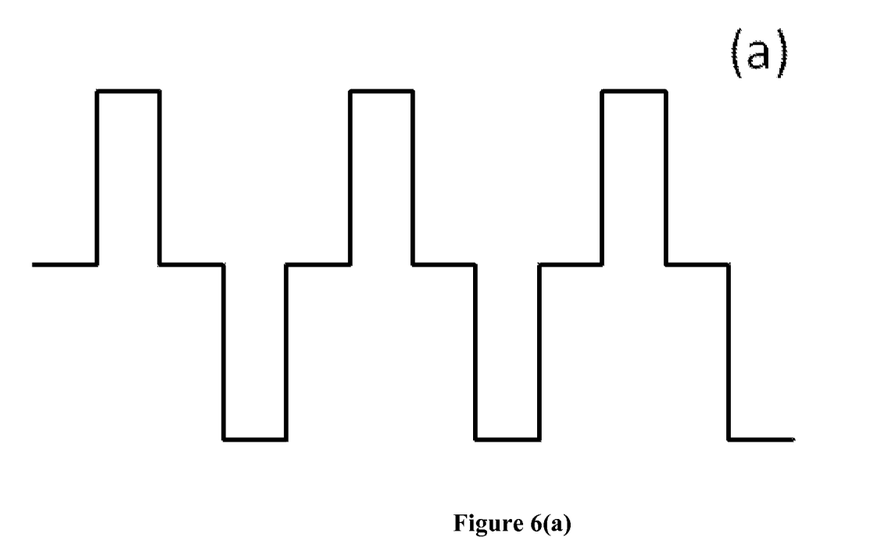
FIG. 6(a) shows the wavelength vs time of a modified square wave that could be used to pump the coherence and repump the hyperfine levels.
Figure 6B:
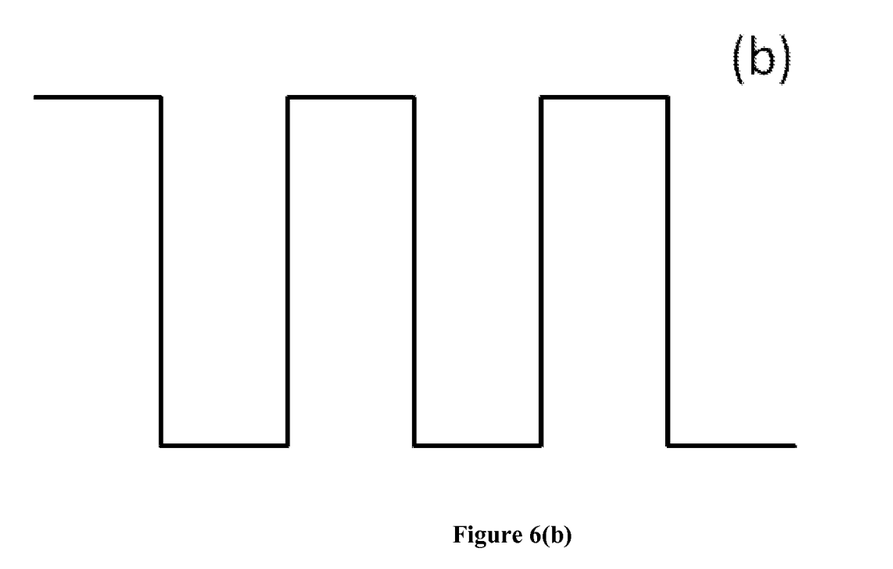
Figure 6C:
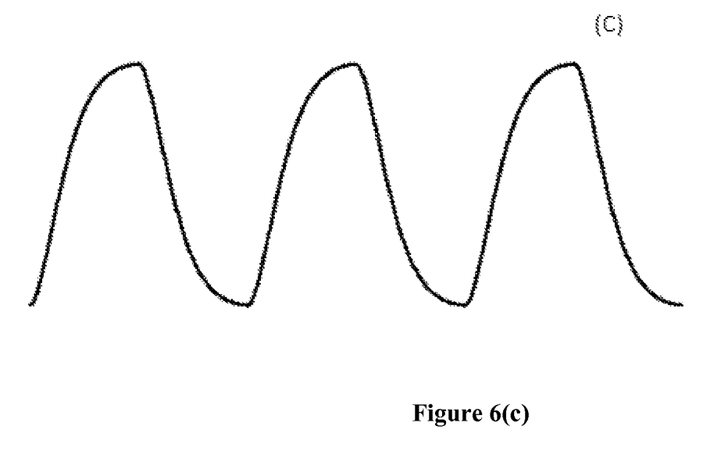

The pump beam can be modulated with a modified square wave or other waveform (FIG. 6(a)) with a duty factor for pumping that is preferably less than or equal to about 50%. If a diode laser is used as the pump source, the wavelength can be modulated by modulating the injection current. The wavelength change depends on thermal effects. If the modulation frequency is sufficiently high (typically greater than 1 kHz), a square modulation waveform with a 50% duty factor applied to the current will give rise to a wavelength modulation similar to that sketched in FIG. 6(c). The duty factor for pumping with such a waveform is less than 50%, so square wave current modulation can give rise to a strong NMOR signal.

In the preferred embodiment, and as readily understood by one of ordinary skill in the art, the apparatus according to the invention will include a general or specific purpose computer or distributed system programmed with computer software implementing the steps described above, which computer software may be in any appropriate computer language, including C++, FORTRAN, BASIC, Java, assembly language, microcode, distributed programming languages, etc. The apparatus may also include a plurality of such computers/distributed systems (e.g., connected over the Internet and/or one or more intranets) in a variety of hardware implementations. For example, data processing can be performed by an appropriately programmed microprocessor, computing cloud, Application Specific Integrated Circuit (ASIC), Field Programmable Gate Array (FPGA), or the like, in conjunction with appropriate memory, network, and bus elements.

Note that in the specification and claims, "about" or "approximately" means within twenty percent (20%) of the numerical amount cited. All computer software disclosed herein may be embodied on any non-transitory computer-readable medium (including combinations of mediums), including without limitation CD-ROMs, DVD-ROMs, hard drives (local or network storage device), USB keys, other removable drives, ROM, and firmware.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An FM-NMOR magnetometer comprising a linearly-polarized pump beam generator generating a center wavelength approximately equal to a center wavelength of hyperfine peaks and generating a modulation amplitude in the range HFS-3×LW (Hyperfine Splitting interval minus three times Line Width) to HFS (Hyperfine Splitting interval) with respect to atoms in an atomic vapor cell through which an output of said beam generator passes, wherein a modulation frequency of said beam generator is determined from a magnetic field measured by said magnetometer.

2. The magnetometer of claim 1 whereby wherein the center laser wavelength is stabilized by feedback from light passing through the atomic vapor cell.

3. The magnetometer of claim 2 additionally comprising a lock-in amplifier adjusted to an odd multiple of the modulation frequency.

4. The magnetometer of claim 2 wherein stabilization is provided by a separate atomic vapor cell.

5. The magnetometer of claim 4 wherein a line width of the separate atomic vapor cell has been broadened by a buffer gas.

6. The magnetometer of claim 1 wherein the modulation amplitude is in the range HFS-2×LW (Hyperfine Splitting interval minus two times Line Width) to HFS-LW (Hyperfine Splitting interval minus Line Width).

7. The magnetometer of claim 1 wherein said generator generates a modulation waveform that is a simple or modified square wave.

8. The magnetometer of claim 1 wherein said generator generates a modulation waveform that is a sine wave.

9. An FM-NMOR magnetometry method comprising providing a linearly-polarized pump beam generator, generating a center wavelength approximately equal to a center wavelength of hyperfine peaks, and generating a modulation amplitude in the range HFS-3×LW (Hyperfine Splitting interval minus three times Line Width) to HFS (Hyperfine Splitting interval) with respect to atoms in an atomic vapor cell through which an output of the beam generator passes, wherein a modulation frequency of the beam generator is determined from a measured magnetic field.

10. The method of claim 9 additionally comprising stabilizing the center laser wavelength by feedback from light passing through the atomic vapor cell.

11. The method of claim 10 additionally comprising adjusting a lock-in amplifier to an odd multiple of the modulation frequency.

12. The method of claim 10 additionally comprising providing stabilization via another atomic vapor cell.

13. The method of claim 12 additionally comprising broadening a line width of the other atomic vapor cell by a buffer gas.

14. The method of claim 9 wherein the modulation amplitude is in the range HFS-2×LW (Hyperfine Splitting interval minus two times Line Width) to HFS-LW (Hyperfine Splitting interval minus Line Width).

15. The method of claim 9 additionally comprising using a modulation waveform that is a simple or modified square wave.

16. The method of claim 9 additionally comprising using a modulation waveform that is a sine wave.

* * * * *